United States Patent
Ou et al.

(10) Patent No.: US 8,356,266 B1
(45) Date of Patent: Jan. 15, 2013

(54) ENABLING A HIGH-LEVEL MODELING SYSTEM

(75) Inventors: Jingzhao Ou, San Jose, CA (US); Chi Bun Chan, San Jose, CA (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 224 days.

(21) Appl. No.: 12/757,945

(22) Filed: Apr. 9, 2010

(51) Int. Cl.
*G06F 17/50* (2006.01)

(52) U.S. Cl. ........ 716/122; 716/104; 716/116; 716/117; 716/118; 716/119; 716/121; 716/139

(58) Field of Classification Search .......... 716/116–119, 716/126, 129–130, 139, 104, 121–122
See application file for complete search history.

(56) References Cited

U.S. PATENT DOCUMENTS

| | | | | |
|---|---|---|---|---|
| 5,629,860 A * | 5/1997 | Jones et al. | .................... | 716/113 |
| 6,002,857 A * | 12/1999 | Ramachandran | ............. | 716/122 |
| 6,493,863 B1 * | 12/2002 | Hamada et al. | ............... | 716/103 |
| 7,103,858 B2 * | 9/2006 | Byrn et al. | .................... | 716/104 |
| 7,178,122 B2 * | 2/2007 | Kishibe | ......................... | 716/102 |
| 7,328,420 B1 * | 2/2008 | Datta et al. | .................... | 716/102 |
| 7,937,682 B2 * | 5/2011 | Arunachalam et al. | ........ | 716/132 |

OTHER PUBLICATIONS

Jang et al., "Energy—and Time Efficient Matrix Multiplication on FPGAS", IEEE Transactions on Very Large Scale Integration (VLSI) Systems, vol. 13, No. 11, Nov. 2005, pp. 1305-1319.

Xilinx, Inc., "System Generator for DSP Getting Started Guide", Systems-Level Modeling in System Generator, Release 10.1, Mar. 2008, pp. 19-38, http://www.xilinx.com/support/sw_manuals/sysgen_bklist.pdf, San Jose, California, USA.

Xilinx, Inc. "PlanAhead Methodology Guide (Release 10.1)", Jan. 2008, pp. 10-28, http://www.xilinx.com/supoort/documentation/sw_manuals/PlanAhead10-1_MethadologyGuide.pdf, San Jose, California, USA.

Sun Microsystems, Inc., "Laying Out Components Within a Container," The Java Tutorial (Fourth Edition), available online at http://java.sun.com/docs/books/tutorial/uiswing/layout/visual.html downloaded on Jun. 23, 2008, 38 pp.

* cited by examiner

*Primary Examiner* — Nghia Doan
(74) *Attorney, Agent, or Firm* — John J. King (57) ABSTRACT

An embodiment of a method for enabling a high level modeling system for implementing a circuit design in an integrated circuit device includes: receiving a high-level characterization of the circuit design; receiving a portable location constraint associated with elements of the circuit design; and generating, by a computer, a low-level characterization of the circuit design based upon the high-level characterization and the portable location constraint.

20 Claims, 4 Drawing Sheets

ENABLING A HIGH-LEVEL MODELING SYSTEM

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

An embodiment of the present invention relates generally to integrated circuits, and in particular, to a method of enabling a high-level modeling system for implementing a circuit design in an integrated circuit device.

BACKGROUND OF THE INVENTION

When planning a layout for an integrated circuit, high-level hardware modeling software tools are often used. A high-level modeling system (HLMS) provides a high-level abstraction of low-level hardware components and intellectual property (IP) cores to be implemented in an integrated circuit. Accordingly, such tools allow electronic designs to be described and simulated in a high-level modeling environment. High-level models generated by an HLMS can then be automatically translated into corresponding low-level hardware implementations.

Unlike design approaches using a traditional hardware description language (HDL) representation of a circuit design, users instantiate high-level modeling blocks and wire them in an HLMS to properly construct a target integrated circuit device. Many HLMS-based design tools provide mechanisms such as automatic rate-and-type propagation, high-level resource estimation and timing analysis tools to facilitate the modeling process.

An HLMS-based design tool generally enables users to more quickly implement a circuit design. More particularly, an HLMS tool provides an efficient layout of a circuit design using circuit elements of the device in which the circuit design is to be implemented. However, conventional HLMS-based design tools have a number of limitations.

SUMMARY OF THE INVENTION

A method of enabling a high-level modeling system to implement a circuit design in an integrated circuit device is disclosed. The method comprises: receiving a high-level characterization of the circuit design; receiving a portable location constraint associated with elements of the circuit design; and generating, by a computer, a low-level characterization of the circuit design based upon the high-level characterization and the portable location constraint.

According to an another embodiment, a method of enabling a high-level modeling system for implementing a circuit design in an integrated circuit device comprises: receiving a high-level characterization of the circuit design; receiving a relationship between circuit elements used to implement the circuit design; and generating, by a computer, a low-level characterization of the circuit design based upon the high-level characterization and the relationship between the circuit elements.

Alternatively, a non-transitory computer-readable storage medium comprising computer-executable code for enabling a high-level modeling system to implement a circuit design in an integrated circuit device, the computer-executable code comprises: code for receiving a high-level characterization of the circuit design; code for receiving a portable location constraint associated with elements of the circuit design; and code for generating a low-level characterization of the circuit design based upon the high-level characterization and the portable location constraint.

DETAILED DESCRIPTION OF THE DRAWINGS

One or more circuits and methods of the present invention relate to a portable location constraint manager for use with high-level modeling systems, and more particularly, a portable location constraint manager which enables various component layout managers. Users can write programs to control the placement of the various portions of a high-level model while maintaining design portability. During low-level implementation generation, the HLMS system automatically generates the low-level location constraints for a specific target device based on the settings of the component layout managers. The location constraints help improve the timing performance and hardware resource usage, and reduce the runtime for synthesis and place-and-route. Portable location constraints set forth in more detail below enable a user to efficiently realize the benefit of location constraints in any number of devices which may be used to implement a circuit design.

Figure 1:
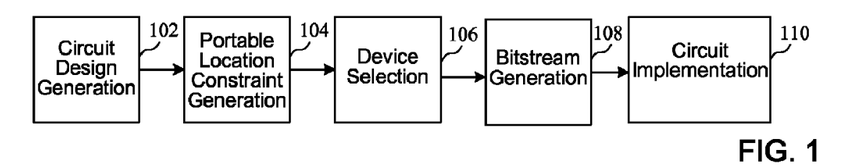
FIG. 1 is a flow diagram of a process for implementing a circuit design based upon portable location constraint according to an embodiment of the present invention.

Turning first to FIG. 1, a flow diagram of a process for implementing a circuit design based upon portable location constraint according to an embodiment of the present invention is shown. During a circuit design generation phase 102, a circuit design is implemented in a high-level format, such as in a hardware description language. A high-level format may comprise a register transfer level (RTL) description for describing the operation of a synchronous digital circuit. In RTL design, a circuit's behavior is defined in terms of the flow of signals (or transfer of data) between hardware registers, and the logical operation performed on those signals. Register transfer level abstraction is used in hardware description languages (HDLs) such as Verilog and VHDL to create high-level representations of a circuit, from which lower-level representations and ultimately wiring can be derived.

Portable location constraints are then generated in a portable location constraint generation phase 104. While location constraints generally provide some description of a physical layout of elements of a portion of a circuit design in elements of the integrated circuit in which the design is implemented, portable location constraints provide a description of a physical layout of the circuit design which is not tied to a particular device. That is, rather than describing a location constraint in terms of elements of an integrated circuit device which may be specific to that integrated circuit device (and may not apply to other integrated circuit devices), portable location constraints are independent of the integrated circuit device in which the circuit design is implemented.

A device is then selected in a device selection phase 106. The device could be any type of integrated circuit device having programmable resources as will be described in more detail below. A bitstream is then generated in a bitstream generation phase 108, where the bitstream is generated based upon some or all of the information generated during the circuit design generation, portable location constraint generation and device selection phases. During a circuit implementation phase 110, the bitstream is implemented in the selected device. Details related to the portable location constraint generation are provided in more detail below in reference to FIGS. 2-3, while details of implementing a configuration bitstream in a device are described in more detail in reference to FIGS. 4-5.

Figure 2:
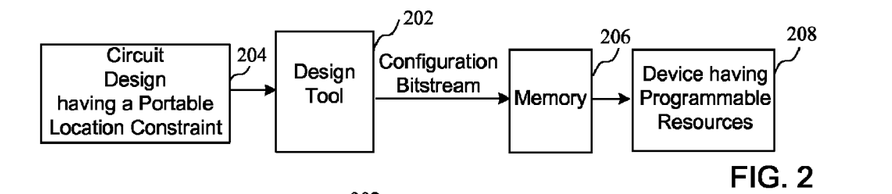
FIG. 2 is a block diagram of a system for implementing a circuit design having a portable location constraint according to an embodiment of the present invention.

Turning now to FIG. 2, a block diagram of a system for implementing a circuit design having a portable location constraint according to an embodiment of the present invention is shown. In particular, a design tool 202 receives a circuit design 204 having one or more portable location constraints. Alternatively, the design tool 202 may separately receive the circuit design and portable location constraint information, and generate a configuration bitstream implementing location constraints as will be described in more detail below. The design tool 202 generates a configuration bitstream which is coupled to a memory 206. The memory 206 may be a non-volatile memory, for example, to provide the configuration bitstream to a device 208 having programmable resources during a power-up phase of the device 208.

Figure 3:
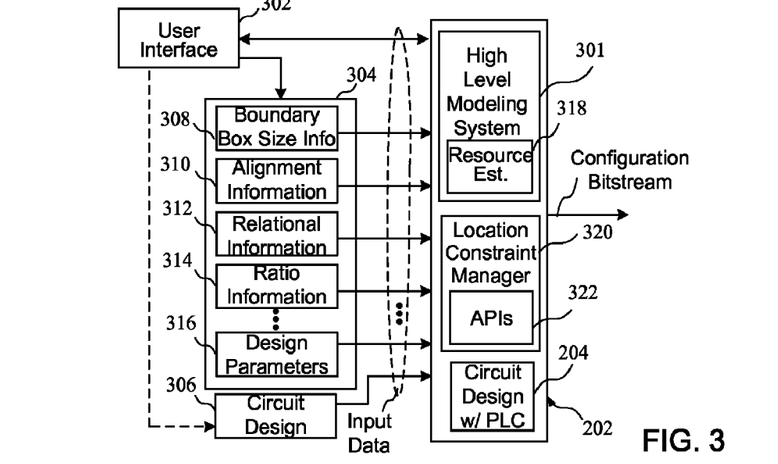
FIG. 3 is a block diagram of a design tool for implementing a circuit design having a portable location constraint according to an embodiment of the present invention.

Turning now to FIG. 3, a block diagram of the design tool 202 according to an embodiment of the present invention is shown. The design tool 202 of FIG. 3 comprises the high-level modeling system 301 coupled to a user interface 302 and a memory 304 which stores portable location constraint information related to the circuit design. The user interface 302 may be associated with a graphical user interface (GUI), as will be described in more detail below. A circuit design 306 is also provided to the high-level modeling system 301. The high-level modeling system 301 operates on the circuit design 204 with one or more portable location constraints to generate a low level implementation of the circuit design in terms of circuit elements of the device in which the circuit design is implemented.

The circuit design with the portable location constraints may be provided directly to the high-level modeling system 301. For example, a user could provide portable locations constraints in code representing the circuit design. According to one embodiment, a high-level representation of the circuit may be annotated with portable location constraints. The portable location constraints are then interpreted by the design tool 202 to provide an implementation of the circuit during a place and route phase.

Portable location constraints may relate to the location, orientation, dimensions or quantity of a given element or elements of the circuit design. Examples of portable location constraints include boundary box size information 308 which indicate a boundary within which a circuit must be contained, alignment information 310 indicating how circuit elements are aligned with respect to one another or with respect to boundaries of the entire circuit, relational information 312 defining the relationship between certain elements, ratio information 314 defining the ratio of one element with respect to another element, or other design parameters 316. While examples of portable location constraints are provided by way of example, it should be understood that other location constraints which define to the location or positioning of elements in a way which is independent of a target device could be implemented according to one or more embodiments of the invention. As will be described in more detail below, a resource estimation tool 318 of the high-level modeling system 301 provides an estimate as to the amount of resources necessary to implement elements of the circuit design based upon the location constraints. Alternatively, the user interface 302 may be implemented to enable a user to enter portable location constraints. For example, a user may enter portable location constraints 308-316. Specific examples and applications of the location constraints 308-316 will be described in more detail below.

A location constraint manager 320 comprising application program interfaces (APIs) 322 enable a high-level modeling system 301 to use the circuit design 306 and the portable location constraints to generate a configuration bitstream which implements the portable location constraint for a selected device. That is, the APIs enable an existing high-level modeling system to operate on the circuit design with portable location constraints to generate a configuration bitstream which implements the circuit design with the portable location constraints. One example of a high-level modeling system 301 is the System Generator (SysGen) for DSP™ design tool available from Xilinx, Inc. of San Jose, Calif. The SysGen design tool is an HLMS design tool based on MATLAB® and Simulink® which are available from The Mathworks, Inc. of Natick, Mass. While examples and specific implementations of one or more circuits and methods of the present invention are described in reference to devices and the SysGen design tool available from Xilinx, Inc., it should be understood that one or more circuits and methods of the present invention may be implemented with any other integrated circuit device and high-level modeling system.

One major benefit of a configuration bitstream generated by design tool 202 is portability, and more particularly the portability of location constraints. That is, a circuit design having portable location constraints may be implemented with those desired location constraints in different hardware platforms by the design tool 202. This is achieved by separating the high-level behavior of a modeling block with its low-level implementations. Users employ a high-level modeling block set provided by a high-level modeling system such as the SysGen design tool to construct their target systems. The behavior of the high-level models are simulated and verified inside the MATLAB/Simulink modeling environment, regardless of their actual low-level implementation. Once the development of the high-level model is complete, users can specify the target hardware platform and enable the design tool to automatically generate the corresponding low-level implementation. The APIs 322 enable the high-level modeling system 301 to generate a configuration bitstream which implements to the circuit design by taking the portable location constraints into account. That is, the APIs 322 enable the high-level modeling system 301 to generate a configuration bitstream which implements the location constraints according to the portable location constraints provided to the high-level modeling system 301.

Before discussing portable location constraints in more detail, two examples are provided to generally illustrate the portability offered by the SysGen design tool. According to a first example, a user selects an adder/subtractor (AddSub) block for the target system. During simulation and verification in MATLAB/Simulink, the AddSub block performs addition and/or subtraction. There is no need to specify the target hardware platform in order to perform simulation and verification in MATLAB/Simulink, as the high-level behavior of the AddSub block is independent of its low-level implementation. The user can then select the target hardware platform and trigger the automatic generation of the low-level implementation. During generation, the SysGen design tool invokes an underlying core generation (CoreGen) tool to generate a corresponding AddSub IP core which realizes the high-level operation in the target device.

According to another example, a digital signal processor block, such as a SysGen DSP48 Macro block implemented by the SysGen design tool, is selected. While the DSP48 hard IP cores available on Spartan®-3 DSP, Virtex®-4 and Virtex-5 FPGAs available from Xilinx, Inc. provide the same functionality, they are somewhat different from each other. In many cases, directly instantiating DSP48 hard IP cores in a design would limit the design to work only on a specific hardware platform. The SysGen DSP48 Macro block addresses this limitation by providing a common high-level interface over the different DSP48 hard IP cores of the different devices. When using the DSP48 Macro block, users can focus on the arithmetic behavior of the high-level modeling block. During HDL netlisting, the SysGen design tool will automatically generate the corresponding low-level implementation using the DSP48 hard IP cores on the target hardware platform.

With the ever increasing complexity of designs using programmable resources, location constraints have played an important role in improving the timing performance and leading to efficient design partitioning. However, due to the lack of a portable location constraint management interface, users may be required to manually enter device-specific location constraints. For example, a user may be required to generate User Constraint File (UCF) files associated with the high-level models. These device specific location constraints break the portability of the high-level models, where such UCF files will lock the portable high-level models to work with only one specific device or a device family.

The design portability associated with portable location constraints offered by one or more circuits and methods of the present invention offer a number of advantages. For example, users can upgrade their designs to target the most current hardware platforms with little effort. Further, users can easily evaluate the performance of their designs over a number of different hardware platforms and identify the most suitable devices for their target systems. The portability also helps improve design re-use. For example, a CORDIC computation engine that is originally designed for use in a low-end FPGA can be re-targeted and used in a high-end FPGA.

The location constraints could be implemented using one or more of many component layout managers available in modern GUI development frameworks. For example, the Java™ Swing GUI framework available from Sun Microsystems of Sunnyvale, Calif. provides various component layout managers such as FlowLayout, BorderLayout, BoxLayout, GridLayout, and GridBagLayout. These component layout managers have enough flexibility and efficiency to place the GUI components in an appropriate way under various circumstances. For different sizes of the top-level GUI interface or different visible components, the component layout managers can place the GUI components with proper sizes and proper positions so that they are suitably implemented. Further, the component layout managers can be hierarchical, and multiple component layout managers can be used together to control the placement of the GUI components. Users may also employ a component layout manager to place a subset of GUI components. Viewing a subset of GUI components as a single entity, the user may employ another component layout manager to place them along with other GUI components. Accordingly, the component layout managers found in many GUI development frameworks may be implemented as APIs which are adapted to be used with HLMS design tools for managing and generating portable location constraints. These component layout managers may be used to control the placement of the various portions of a high-level model in circuit elements of the device implementing a circuit design. The low-level location constraints for a specific target device are automatically generated based on the settings of the component layout managers.

The APIs of the location constraint manager and the methods for automatically generating the low-level location constraints are now discussed in more detail. The APIs and the layout algorithms may be based upon a GUI development framework, for example, where it is necessary to adapt them to be used in high-level modeling systems and for integrated circuit hardware development.

There are different ways to associate component layout managers with high-level models. According to one embodiment, a component layout manager is instantiated and associated with the handle of the target Simulink block. This is, the component layout managers may be implemented in the graphical Simulink modeling environment according to the following pseudocode:

% instantiate an xlFlowLayout manager and
  % associate it with a specific subsystem or SysGen block
     layout=xlFlowLayout(blockHandle);
  % add the subblocks underneath the subsystem to the layout manager
  layout.add(subblockHandle__1);
  layout.add(subblockHandle__2);

Since an embodiment of the location constraint manager of the present invention is a programming interface, an associated layout manager can be duplicated and applied to the copied subsystems when users make multiple copies of the subsystem.

Another way of using the component layout managers is through the SysGen programmatic generation interface. When using the SysGen design tool, users can specify the component layout manager of an xBlock object. That is, all the objects instantiated by the xBlock object are laid out using the associated layout manager according to the following pseudocode:

% instantiate an xBlock object and associate a layout manager with it source=struct('source', str2func('construction_function'), . . . 'layout', xlFlowLayout( ));
  xBlockOjb=xBlock(source, { }, inputPortBinding, outputPortBinding).

Some examples of location constraints being implemented by using component layout managers are now provided. A first example relates to the location of certain circuit blocks.

When implementing a CORDIC computation engine and a matrix multiplication, for example, these two designs may be implemented as a linear pipeline of processing elements (PEs). It is desired that two adjacent PEs are placed next to each other so that the connections between the two adjacent PEs can be realized using the short wires on the integrated circuit device. Placing the PEs adjacent to each other may lead to improved timing performance and routing resource usage. It should be noted that this placement of PEs is desired regardless the underlying targeted hardware platforms. Accordingly, users can simply instantiate an xlFlowLayout manager associated with the high-level modeling system and add the PEs to the manager. Upon the generation of low-level HDL/NGC/bitstream implementations, the SysGen design tool will automatically generate the location constraints for the target device. Just as in the case of a FlowLayout component layout manager defined in the GUI development frameworks, xlFlowLayout allows placing the PEs in different orientations, such a horizontal or vertical.

According to one embodiment, location constraints related to size, padding and alignment may be implemented. The size information is used by the component layout managers to determine the shapes and sizes of the automatically generated bounding boxes for a specific hardware device. The component layout managers could consider the number of slices, flipflops, lookup tables (LUTs), blocks of random access memory (BRAMs), and DSP48 blocks, for example. By default, the SysGen design tool uses the hardware resource usage reported by the resource estimator block to determine the sizes of the bounding boxes for the design portions managed by the location constraint manager. Users can set a size-factor property to force the component layout manager to scale the resource estimation from the resource estimator block. In the following example, a size factor is set to 1.2. If the number of slices reported by the resource estimator block is 200, then the component layout manager will assume that 200×1.2=240 slices are required by the high-level block and generate the bounding box accordingly.

In addition to the size information, users can also specify a ratio property, such as the ratio of the height and the width of the component layout manager or a high-level block added to a component layout manager. By default, the ratio may be set to 1. With both the size information and the ratio, a component layout manager is able to determine the sizes of the low-level bounding boxes during the generation of low-level designs. For example, if a high-level block requires 256 slices and the ratio of its layout manager is set to 1, a bounding box with both height and width of 16 slices are generated.

In some design cases, users may want to provide size hints. For example, three component methods may be provided for setting size hints: a minimum size (xlSetMinimumSize), a preferred size (xlSetPreferSize), and a maximum size (xlSetMaximumSize). For example, a minimum size required by a high-level block when generating a low-level bounding box to constraint it may indicate that each of a width and a height may be limited to a certain number of slices or BRAMs.

Users can also specify the padding between the bounding boxes. The padding between the high-level blocks/subsystems comprises reserved places for implementing the connections between them. For example, if there are many connections between two high-level subsystems, users can add more padding space between them in order to alleviate potential routing congestion.

Users can further specify the alignments of the high-level blocks contained by a component layout manager. The alignment hints provide more fine controls to specify relative location constraints between two high-level design portions.

According to another embodiment, device-specific location constraints may be implemented. The generation of device-specific location constraints is an automated process that occurs along with the automatic low-level implementation generation. More specifically, the generation of device-specific location constraints is divided into two steps. During a first step, sizes of the low-level bounding boxes for the high-level modeling blocks are determined. During a second step, a flattened representation of the high-level model is generated. The placement of the bounding boxes obtained in Step 1 on the target device is determined by the layout algorithms of the managers that contain them.

There are two kinds of outputs by the component layout managers. The first is a UCF file that describes the bounding boxes on the target device. The second is in the PBlock format which can be later used in a PlanAhead™ software tool also available from Xilinx, Inc. The benefit of the PBlock output is that users can use the PlanAhead software tool to perform further analysis of the automatically generated location constraints based on the output from the downstream tools.

Figure 4:
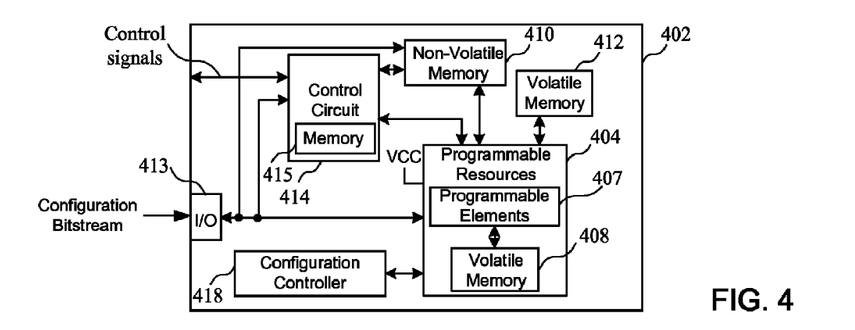
FIG. 4 is a block diagram of a circuit having programmable resources according to an embodiment of the present invention.

Turning now to FIG. 4, a block diagram of a circuit having programmable resources according to an embodiment of the present invention is shown. As will be described in more detail below, the configuration bitstream generated using the portable location constraints may be implemented in the device 208 having programmable resources, such as a device 402 incorporating programmable resources 404. According to the embodiment of FIG. 4, the programmable resources may comprise volatile memory 408, and may be coupled to other circuits such as a non-volatile memory 410 or a volatile memory 412. The non-volatile memory 410 may be coupled to an I/O port 413 of the device, enabling a configuration bitstream to be coupled to a control circuit 414 having a memory 415 or a configuration controller 418 to load the configuration bitstream in the device. As will be described in more detail below, the control circuit may be a processor, where the memory 415 of the processor may be a memory cache for storing program code or data. The configuration bitstream may be loaded into the non-volatile memory 410 of the device 402, and then loaded into the volatile memory 408 and the volatile memory 412. Alternatively, the configuration bitstream may be loaded directly into the volatile memory 408 and the volatile memory 412 by the control circuit 414 or the configuration controller 418.

Figure 5:
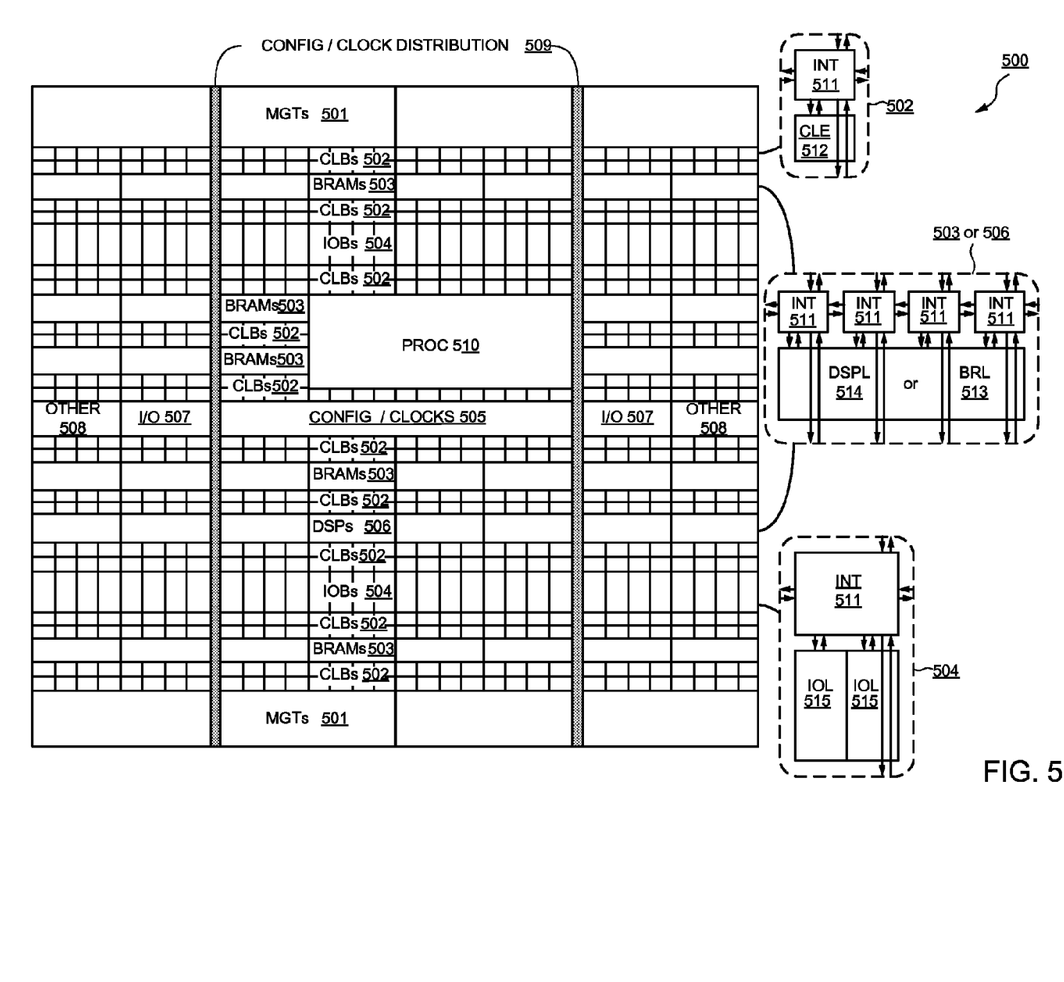
FIG. 5 is a block diagram of a circuit having programmable resources according to an alternate embodiment of the present invention.

Turning now to FIG. 5, a block diagram of an integrated circuit device having programmable resources according to an alternate embodiment the present invention is shown. While devices having programmable resources may be implemented in any type of integrated circuit device, such as an application specific integrated circuit (ASIC) having programmable resources, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 5 comprises an FPGA architecture 500 having a large number of different programmable tiles including multi-gigabit transceivers (MGTs) 501, CLBs 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507 (e.g., configuration ports and clock ports), and other programmable logic 508 such as digital clock managers, analog-to-digital converters, system monitoring logic, and so forth. Some FPGAs also include dedicated processor blocks (PROC) 510, which may be used to implement a software application, for example.

In some FPGAs, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA. The programmable interconnect element 511 also includes the connections to and from the programmable logic element within the same tile, as shown by the examples included at the top of FIG. 5.

For example, a CLB 502 may include a configurable logic element (CLE) 512 that may be programmed to implement user logic plus a single programmable interconnect element 511. A BRAM 103 may include a BRAM logic element (BRL) 513 in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 506 may include a DSP logic element (DSPL) 514 in addition to an appropriate number of programmable interconnect elements. An IOB 504 may include, for example, two instances of an input/output logic element (IOL) 515 in addition to one instance of the programmable interconnect element 511. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a horizontal area near the center of the die is used for configuration, clock, and other control logic. Vertical areas 509 extending from this column are used to distribute the clocks and configuration signals across the breadth of the FPGA. Some FPGAs utilizing the architecture illustrated in FIG. 5 include additional logic blocks that disrupt the regular columnar structure making up a large part of the FPGA. The additional logic blocks may be programmable blocks and/or dedicated logic. For example, the processor block PROC 510 shown in FIG. 5 spans several rows of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Figure 6:
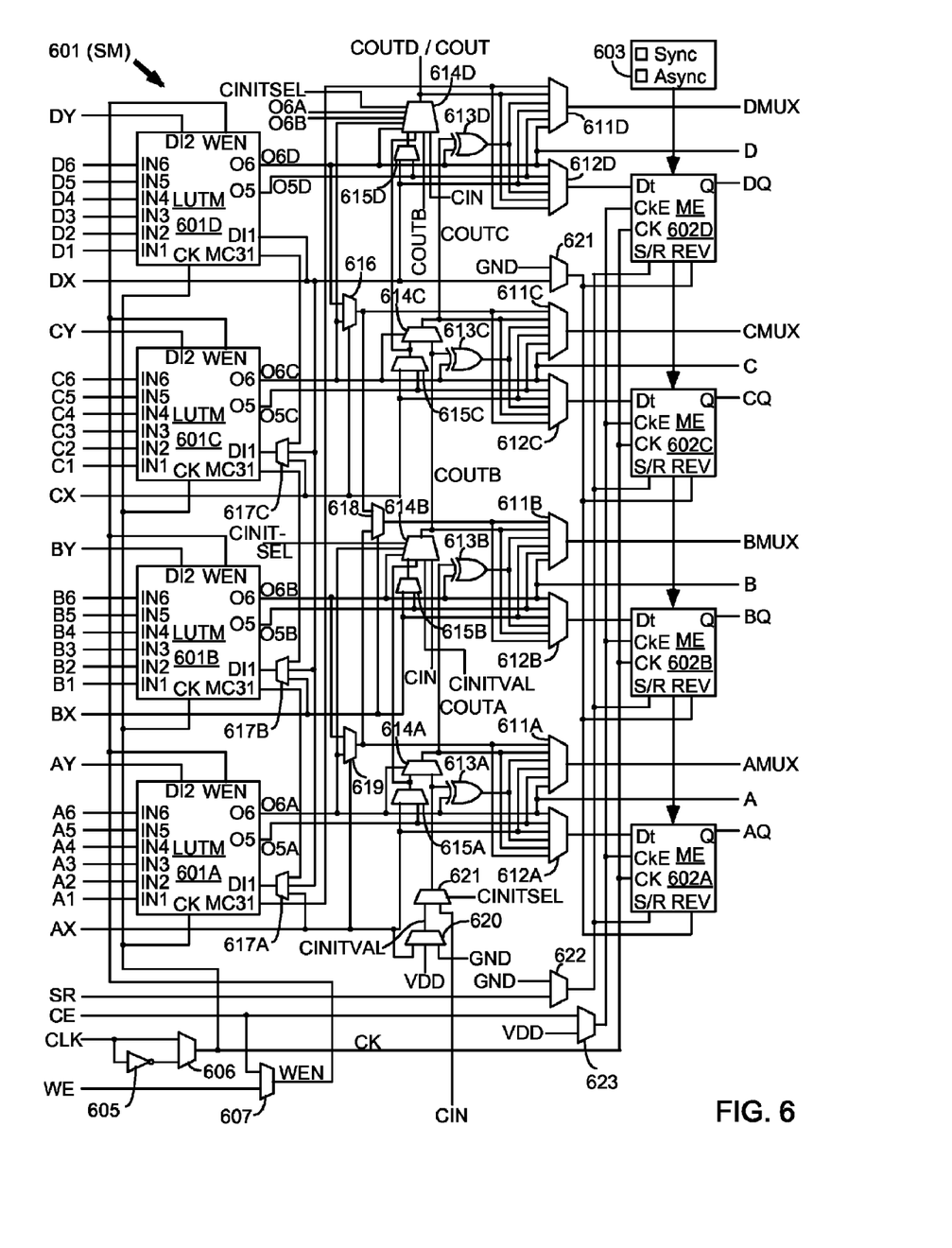
FIG. 6 is a block diagram of a configurable logic element of the circuit of FIG. 5 according to an embodiment of the present invention.

Turning now to FIG. 6, a block diagram of a configurable logic element of the circuit of FIG. 5 according to an embodiment of the present invention is shown. In particular, FIG. 6 illustrates in simplified form a configurable logic element 512 of a configurable logic block 502 of FIG. 5. In the embodiment of FIG. 6, slice M 601 includes four lookup tables (LUTMs) 601A-601D, each driven by six LUT data input terminals A1-A6, B1-B6, C1-C6, and D1-D6 and each providing two LUT output signals O5 and O6. The O6 output terminals from LUTs 601A-601D drive slice output terminals A-D, respectively. The LUT data input signals are supplied by the FPGA interconnect structure via input multiplexers, which may be implemented by programmable interconnect element 611, and the LUT output signals are also supplied to the interconnect structure. Slice M also includes: output select multiplexers 611A-611D driving output terminals AMUX-DMUX; multiplexers 612A-612D driving the data input terminals of memory elements 602A-602D; combinational multiplexers 616, 618, and 619; bounce multiplexer circuits 622-623; a circuit represented by inverter 605 and multiplexer 606 (which together provide an optional inversion on the input clock path); and carry logic comprising multiplexers 614A-614D, 615A-615D, 620-1021 and exclusive OR gates 613A-613D. All of these elements are coupled together as shown in FIG. 6. Where select inputs are not shown for the multiplexers illustrated in FIG. 6, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 6 for clarity, as well as from other selected figures herein.

In the pictured embodiment, each memory element 602A-602D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 602A-602D are clocked by a clock signal CK, which may be provided by a global clock network or by the interconnect structure, for example. Such programmable memory elements are well known in the art of FPGA design. Each memory element 602A-602D provides a registered output signal AQ-DQ to the interconnect structure. Because each LUT 601A-601D provides two output signals, O5 and O6, the LUT may be configured to function as two 5-input LUTs with five shared input signals (IN1-IN5), or as one 6-input LUT having input signals IN1-IN6.

In the embodiment of FIG. 6, each LUTM 601A-601D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 617A-617C for LUTs 601A-601C), or to the two 32-bit RAMs via input terminals DI1 and DI2. RAM write operations in the LUT RAMs are controlled by clock signal CK from multiplexer 606 and by write enable signal WEN from multiplexer 607, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 601A may also be provided to the general interconnect structure for shift register chaining, via output select multiplexer 611D and CLE output terminal DMUX.

Figure 7:
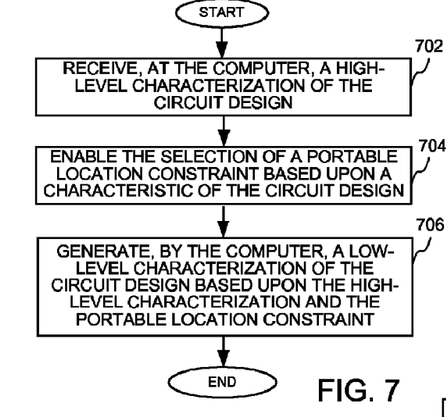
FIG. 7 is a flow chart showing a method of enabling a high-level modeling system to implement a circuit design in an integrated circuit according to an embodiment of the present invention.

Turning now to FIG. 7, a flow chart shows a method of enabling a high-level modeling system to implement a circuit design in an integrated circuit according to an embodiment of the present invention. In particular, a high-level characterization of the circuit design is received at a computer at a step 702. The selection of a portable location constraint is enabled based upon a characteristic of the circuit design at a step 704. The selection may be based upon location constraints provided by a user with the code for a circuit design, location constraints input by a user using a GUI, or location constraints automatically generated by a computer based upon characteristics of the circuit design. A low-level characterization of the circuit design is then generated based upon the high-level characterization and the portable location constraint at a step 706.

Figure 8:
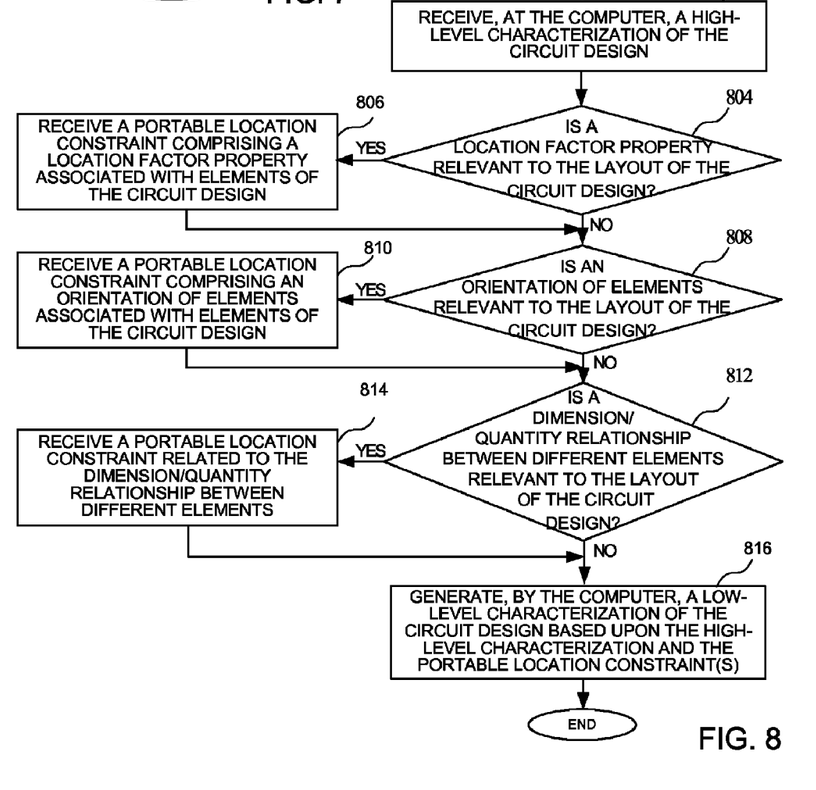
FIG. 8 is a flow chart showing a method of enabling a high-level modeling system to implement a circuit design in an integrated circuit according to an alternate embodiment of the present invention.

Turning now to FIG. 8, a flow chart shows a method of enabling a high-level modeling system to implement a circuit design in an integrated circuit according to an alternate embodiment of the present invention. A high-level characterization of the circuit design is received at a step 802. It is then determined whether a location factor property is relevant to the layout of the circuit design at a step 804. A location factor property may be any type of location constraint, such as those set forth above, which constrain the positioning of elements of the circuit design. If so, a portable location constraint comprising a location factor property associated with elements of the circuit design is received at a step 806. It is also determined whether an orientation of elements is relevant to the layout of the circuit design at a step 808. If so, a portable location constraint comprising an orientation of elements associated with elements of the circuit design is received at a step 810. It is then determined whether a dimension/quantity relationship between different elements is relevant to the layout of the circuit design at a step 812. Such a dimension/quantity relationship may relate to dimensions of individual elements, groups of elements, quantities of elements or groups of elements, or dimensions or quantities of an element with respect to other elements. If so, a portable location constraint related to the dimension/quantity relationship between different elements is received at a step 814. A low-level characterization of the circuit design based upon the high-level characterization and the portable location constraint(s) is then generated at a step 816. The methods of FIGS. 7 and 8 may be implemented using any of the circuits of FIGS. 1-6 as described above.

According to one embodiment, computer-readable storage medium could be implemented, such as in the design tool 202 for example, for enabling a high-level modeling system to implement a circuit design in an integrated circuit device. The computer-readable storage medium may comprise computer-executable code, including code for receiving a high-level characterization of the circuit design; code for receiving a portable location constraint associated with elements of the circuit design; and code for generating a low-level characterization of the circuit design based upon the high-level characterization and the portable location constraint.

The code for receiving a portable location constraint may comprise code for receiving a size factor property, code for receiving a ratio property, or code for receiving an orientation of elements. The code for receiving an orientation of elements may comprise code for receiving a flow of elements or code for receiving a grouping of elements. The computer-readable storage medium may comprise code for enabling the selection of a portable location constraint based upon a characteristic of the circuit design. For example, the code could enable a graphical user interface. Other code could be implemented according to other aspects of the methods and circuits set forth above.

It can therefore be appreciated that the new and novel method of enabling a high-level modeling system has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A method of enabling a high-level modeling system for implementing a circuit design in an integrated circuit device, the method comprising:
   receiving a hardware description language characterization of the circuit design;
   identifying elements of the circuit design which are independent of the integrated circuit device;
   receiving a portable location constraint associated with elements of the circuit design, wherein the portable location constraint is independent of the integrated circuit device, and identifies an alignment of elements of a group of a common element with respect to one another; and
   generating, by a computer during a place and route operation, a low-level characterization of the circuit design based upon the hardware description language characterization and the portable location constraint, wherein the low-level characterization is provided in terms of circuit elements of the integrated circuit device in which the circuit design is implemented.

2. The method of claim 1 wherein receiving a portable location constraint comprises receiving a size factor property.

3. The method of claim 1 wherein receiving a portable location constraint comprises receiving a ratio property.

4. The method of claim 1 wherein receiving a portable location constraint comprises receiving an orientation of elements.

5. The method of claim 4 wherein receiving an orientation of elements comprises receiving a flow of elements.

6. The method of claim 4 wherein receiving an orientation of elements comprises receiving a grouping of elements.

7. The method of claim 1 wherein receiving a portable location constraint further comprises enabling the selection of the portable location constraint based upon a characteristic of the circuit design.

8. A method of enabling a high-level modeling system to implement a circuit design in an integrated circuit device, the method comprising:
 identifying elements of a circuit design which are independent of the integrated circuit device;
 receiving a hardware description language characterization of the circuit design;
 receiving a portable location constraint comprising size information for circuit elements used to implement the circuit design, wherein the portable location constraint is independent of the integrated circuit device, and identifies an alignment of elements of a group of a common element with respect to one another; and
 generating, by a computer during a place and route operation, a low level characterization of the circuit design based upon the hardware description language characterization and the size information for the circuit elements, wherein the low-level characterization is provided in terms of circuit elements of the integrated circuit device in which the circuit design is implemented.

9. The method of claim 8 further comprising receiving an orientation of the circuit elements.

10. The method of claim 8 wherein receiving size information for circuit elements comprises receiving a percentage of a circuit block implementing a portion of the circuit design.

11. The method of claim 8 wherein receiving size information for circuit elements comprises receiving relative dimensions of a portion of the circuit design.

12. The method of claim 8 further comprising receiving circuit requirements for a first element of the circuit elements and determining circuit requirements for a second element of the circuit elements based upon the circuit requirements for the first element.

13. The method of claim 8 further comprising implementing the circuit in a device having programmable resources.

14. A non-transitory computer-readable storage medium comprising computer-executable code for enabling a high-level modeling system to implement a circuit design in an integrated circuit device, the computer-executable code comprising:
 code for identifying elements of a circuit design which are independent of the integrated circuit device;
 code for receiving a hardware description language characterization of the circuit design;
 code for receiving a portable location constraint associated with elements of the circuit design, wherein the portable location constraint is independent of the integrated circuit device, and identifies an alignment of elements of a group of a common element with respect to one another; and
 code for generating a low-level characterization of the circuit design based upon the hardware description language characterization and the portable location constraint, wherein the low-level characterization is provided in terms of circuit elements of the integrated circuit device in which the circuit design is implemented.

15. The non-transitory computer-readable storage medium of claim 14 wherein the code for receiving a portable location constraint comprises code for receiving a size factor property.

16. The non-transitory computer-readable storage medium of claim 14 wherein the code for receiving a portable location constraint comprises-code for receiving a ratio property.

17. The non-transitory computer-readable storage medium of claim 14 wherein the code for receiving a portable location constraint comprises code for receiving an orientation of elements.

18. The non-transitory computer-readable storage medium of claim 17 wherein the code for receiving an orientation of elements comprises code for receiving a flow of elements.

19. The non-transitory computer-readable storage medium of claim 17 wherein the code for receiving an orientation of elements comprises code for receiving a grouping of elements.

20. The non-transitory computer-readable storage medium of claim 14 further comprising code for enabling the selection of the portable location constraint based upon a characteristic of the circuit design.

\* \* \* \* \*